(12) United States Patent
Koshihara et al.

(10) Patent No.: US 9,954,201 B2
(45) Date of Patent: Apr. 24, 2018

(54) ELECTROOPTICAL DEVICE, ELECTROOPTICAL DEVICE MANUFACTURING METHOD, AND ELECTRONIC APPARATUS

(71) Applicant: SEIKO EPSON CORPORATION, Tokyo (JP)

(72) Inventors: Takeshi Koshihara, Matsumoto (JP); Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/423,155

(22) Filed: Feb. 2, 2017

(65) Prior Publication Data

US 2017/0237039 A1   Aug. 17, 2017

(30) Foreign Application Priority Data

Feb. 15, 2016   (JP) .................. 2016-026437

(51) Int. Cl.
*H01L 27/32* (2006.01)
*H01L 51/52* (2006.01)

(52) U.S. Cl.
CPC ...... *H01L 51/5271* (2013.01); *H01L 27/3276* (2013.01)

(58) Field of Classification Search
CPC .................................. H01L 27/3262
See application file for complete search history.

(56) References Cited

U.S. PATENT DOCUMENTS

| 2004/0070808 | A1 | 4/2004 | Nakanishi | |
|---|---|---|---|---|
| 2010/0052524 | A1* | 3/2010 | Kinoshita | H01L 27/3213 313/504 |
| 2010/0062583 | A1* | 3/2010 | Hanaoka | H01L 21/76254 438/458 |
| 2014/0368106 | A1* | 12/2014 | Nozawa | H01L 51/5253 313/317 |
| 2015/0001558 | A1* | 1/2015 | Nozawa | H01L 51/5265 257/88 |
| 2015/0102323 | A1 | 4/2015 | Koshihara et al. | |

(Continued)

FOREIGN PATENT DOCUMENTS

| JP | 2005-321815 A | 11/2005 |
|---|---|---|
| JP | 2006-018085 A | 1/2006 |
| JP | 2013-089444 A | 5/2013 |

(Continued)

*Primary Examiner* — Thao P Le
(74) *Attorney, Agent, or Firm* — Oliff PLC (57) ABSTRACT

Reflection layers are arranged for respective pixels with predetermined intervals in a row direction (X direction) and a column direction (Y direction) in a display region, and, subsequently to the display region, are arranged in the same manner with the predetermined intervals in the row direction (X direction) and the column direction (Y direction) also in a peripheral region around the display region. First electrodes, first light path adjusting layers, and second light path adjusting layers are arranged for the respective pixels in the display region, and are arranged so as to correspond to the respective reflection layers also in the peripheral region. The respective reflection layers are partially connected to each other in the peripheral region and are electrically connected to a second electrode at a cathode potential.

9 Claims, 10 Drawing Sheets

(56) References Cited

U.S. PATENT DOCUMENTS

2017/0229677 A1* 8/2017 Koshihara ........... H01L 51/5265
2017/0293171 A1* 10/2017 Yamazaki ............. G02F 1/1368

FOREIGN PATENT DOCUMENTS

| JP | 2015-005342 A | 1/2015 |
| JP | 2015-062194 A | 4/2015 |
| JP | 2015-076300 A | 4/2015 |
| JP | 2016-122613 A | 7/2016 |

* cited by examiner

FIG. 16

ELECTROOPTICAL DEVICE, ELECTROOPTICAL DEVICE MANUFACTURING METHOD, AND ELECTRONIC APPARATUS

BACKGROUND

1. Technical Field

The present disclosure relates to an electro-optical device, an electro-optical device manufacturing method, and an electronic apparatus.

2. Related Art

In recent years, an electro-optical device using organic light emitting diodes (OLED) as light emitting elements has been used in an electronic apparatus capable of forming a virtual image, such as a head mount display. As an example of the electro-optical device, as disclosed in JP-A-2015-62194, a device that includes reflection layers for respective pixels and adjusts light paths based on optical distances between the reflection layers and pixel electrodes with cavity structures has been proposed.

Furthermore, JP-A-2006-18085 discloses an electro-optical device in which pixels are arrayed in a display region displaying an image and dummy pixels that do not contribute to display of the image actually are arrayed in an adjacent region around the display region. The pixels in the display region include light emitting elements in which light emitting layers are interposed between anodes and cathodes. On the other hand, no anode is formed in the dummy pixels in the adjacent region.

In the device having the configuration as disclosed in JP-A-2015-62194, a power supply line is used as the reflection layer in some cases. In such a case, defects on insulating films that are formed between the power supply line as the reflection layer and the pixel electrodes may cause the power supply line and the pixel electrodes to be short-circuited. For example, the defects on the insulating films tend to be generated on the boundary between the display region and the adjacent region around the display region.

In JP-A-2006-18085, the electrodes (anodes) configuring the light emitting elements of the pixels in the display region are not provided in the dummy pixels in the adjacent region. This configuration causes steps corresponding to film thicknesses of the electrodes to be generated between the display region and the adjacent region. Accordingly, uniformity of etching of insulating films is lowered and the above-described defect can be generated in some cases. Furthermore, due to lowering in the uniformity of the etching of the insulating films, the light path lengths are not stable and desired wavelengths cannot be obtained in the pixels in some cases.

SUMMARY

An advantage of some aspects of the embodiment is to provide an electro-optical device capable of preventing a defect on insulating films that are formed between reflection layers and pixel electrodes from being generated when the reflection layers are provided for respective pixels, an electro-optical device manufacturing method, and an electronic apparatus including the electro-optical device.

An electro-optical device according to an aspect of the embodiment includes first conductive layers in which light-reflective electrodes are arrayed in both of a display region and a peripheral region as a region around the display region, second conductive layers in which electrodes are arrayed in both of the display region and the peripheral region so as to overlap with the first conductive layers, a third conductive layer that is arranged so as to overlap with the second conductive layers, insulating layers that are arranged between the first conductive layers and the second conductive layers, and a light-emitting functional layer that is arranged between the second conductive layers and the third conductive layer. A portion of the first conductive layers arranged in the peripheral region are electrically connected to each other with respective connection portions arranged in the same layer as the first conductive layers, and a cathode potential or a ground potential is applied to the first conductive layers arranged in the peripheral region.

With the aspect of the embodiment, the light-reflective first conductive layers are arranged in both of the display region and the peripheral region as the region around the display region. The second conductive layers are arranged in both of the display region and the peripheral region so as to overlap with the first conductive layers. Accordingly, the display region and the peripheral region have the same pattern density and uniformity of etching of the insulating layers is improved. As a result, generation of defects on the insulating layers is suppressed. Furthermore, the cathode potential or the ground potential is applied to the first conductive layers arranged in the peripheral region. Therefore, even if the defects on the insulating layers are generated, the first conductive layers arranged in the peripheral region have the cathode potential or the ground potential and light emission of pixels can thereby be suppressed.

In the electro-optical device according to the above-described aspect of the embodiment, a portion of the second conductive layers arranged in the peripheral region may be electrically connected to the third conductive layer in at least a portion of the peripheral region in which the light-emitting functional layer is not formed, and the cathode potential may be applied to a portion of the third conductive layer, which overlaps with the display region, and the third conductive layer may be electrically connected to the portion of the first conductive layers arranged in the peripheral region. With the aspect of the embodiment, even if the defects on the insulating layers are generated and the second conductive layers and the first conductive layers are electrically connected to each other, both of the second conductive layers and the third conductive layer have the cathode potential and light emission of the pixels can thereby be suppressed.

The electro-optical device in the above-described aspect of the embodiment may further include a fourth conductive layer to which a ground potential is applied, wherein the fourth conductive layer is electrically connected to the portion of the first conductive layers arranged in the peripheral region. With the aspect of the embodiment, even if the defects on the insulating layers are generated and the second conductive layers and the first conductive layers are electrically connected to each other, the second conductive layers have the ground potential and light emission of the pixels can thereby be suppressed.

The electro-optical device in the above-described aspect of the embodiment may further include an etching stop layer between the insulating layers and the first conductive layers, wherein the etching stop layer overlaps with end portions of the insulating layers when seen from the above. With the aspect of the embodiment, the etching stop layer overlaps with the end portions of the insulating layers when seen from the above. Therefore, even when another insulating layers are further laminated on the insulating layers, etching can be performed without influencing the first conductive layer under the etching stop layer.

An electro-optical device manufacturing method according to another aspect of the embodiment includes arraying first conductive layers as light-reflective electrodes in both of a display region and a peripheral region as a region around the display region, forming insulating layers on the first conductive layers, arraying second conductive layers in both of the display region and the peripheral region so as to overlap with the first conductive layers, forming a light-emitting functional layer on the second conductive layers, and forming a third conductive layer so as to overlap with the second conductive layers. A portion of the first conductive layers arranged in the peripheral region are electrically connected to each other with respective connection portions arranged in the same layer as the first conductive layers, and are electrically connected to a supply part of a cathode potential or a ground potential.

With the aspect of the embodiment, the light-reflective first conductive layers are arranged in both of the display region and the peripheral region as the region around the display region. The second conductive layers are arranged in both of the display region and the peripheral region so as to overlap with the first conductive layers. Accordingly, the display region and the peripheral region have the same pattern density and uniformity of etching of the insulating layers is improved. As a result, generation of defects on the insulating layers is suppressed. Furthermore, the cathode potential or the ground potential is applied to the first conductive layers arranged in the peripheral region. Therefore, even if the defects on the insulating layers are generated, the first conductive layers arranged in the peripheral region have the cathode potential or the ground potential and light emission of pixels can thereby be suppressed.

An electronic apparatus according to still another aspect of the embodiment includes the electro-optical device in the above-described aspect of the embodiment. The electronic apparatus providing high image quality with stable light path lengths without pixel failure due to short circuit of pixel electrodes can be provided with the electro-optical device including light emitting elements such as OLEDs.

BRIEF DESCRIPTION OF THE DRAWINGS

The embodiment will be described with reference to the accompanying drawings, wherein like numbers reference like elements.

DESCRIPTION OF EXEMPLARY EMBODIMENTS

An embodiment will be described with reference to the drawings. It should be noted that in the following drawings, scales are made different for respective layers and respective members in order to make the layers and the members have sizes capable of being recognized in the drawings.

Figure 1:
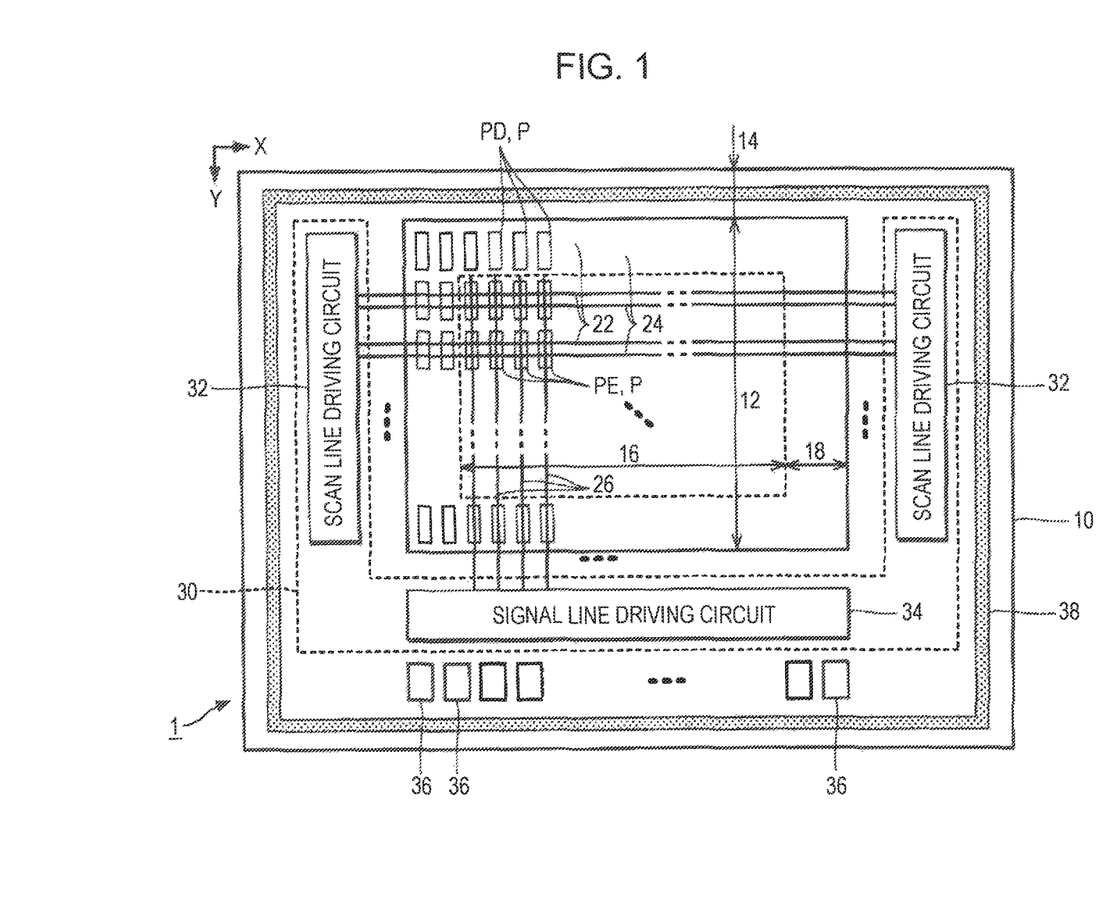
FIG. 1 is a plan view illustrating an electro-optical device according to an embodiment.

FIG. 1 is a plan view illustrating an electro-optical device 1 according to an embodiment. The electro-optical device 1 in the embodiment is an organic electroluminescence (EL) device in which light emitting elements using an organic EL material are formed on the surface of a substrate 10. The substrate 10 is a plate-like member (semiconductor substrate) formed with a semiconductor material such as silicon and is used as a base member (base) on which the plurality of light emitting elements are formed. As illustrated in FIG. 1, the surface of the substrate 10 is divided into a first region 12 and a second region 14. The first region 12 is a rectangular region and the second region 14 is a rectangular frame-like region surrounding the first region 12.

In the first region 12, a plurality of scan lines 22 extending in a row direction (X direction), a plurality of control lines 24 extending in the row direction (X direction) so as to correspond to the respective scan lines 22, and a plurality of signal lines 26 extending in a column direction (Y direction) intersecting with the row direction (X direction) are formed. Pixels P (PD, PE) are formed so as to correspond to respective intersections between the plurality of scan lines 22 and the plurality of signal lines 26. Accordingly, the plurality of pixels P are arrayed in a matrix form in the row direction (X direction) and the column direction (Y direction).

A driving circuit 30, a plurality of mounting terminals 36, and a guard ring 38 are installed in the second region 14. The driving circuit 30 is a circuit for driving the respective pixels P and is configured by including two scan line driving circuits 32 installed at positions between which the first region 12 is interposed in the row direction (X direction) and a signal line driving circuit 34 installed in a region extending in the row direction (X direction) in the second region 14. The plurality of mounting terminals 36 are formed in a region at the opposite side to the first region 12 with the signal line driving circuit 34 interposed therebetween and are electrically connected to external circuits (for example, an electronic circuit mounted on a flexible wiring substrate that is bonded to the substrate 10) such as a control circuit and a power supply circuit through the wiring substrate (not illustrated).

The plurality of electro-optical devices 1 in the embodiment are collectively formed by cutting (scribing) a raw substrate having a size corresponding to a plurality of substrates 10. The guard ring 38 in FIG. 1 prevents impact and static electricity at the time of cutting of the raw substrate from influencing the driving circuit 30 or the respective pixels P and prevents water from entering from end surfaces (cut surfaces of the raw substrate) of each substrate 10. As illustrated in FIG. 1, the guard ring 38 is formed in a ring shape (rectangular frame-like shape) surrounding the driving circuit 30, the plurality of mounting terminals 36, and the first region 12.

The first region 12 in FIG. 1 is divided into a display region 16 and a peripheral region 18. The display region 16 is a region in which an image is displayed actually by driving of the respective pixels P. The peripheral region 18 is a rectangular frame-like region surrounding the display region 16 and pixels P (hereinafter, referred to as "dummy pixels PD") that do not contribute to display of the image actually although having similar structures to those of the respective pixels P in the display region 16 are arranged in the peripheral region 18. In the following description, the pixels P in the display region 16 are expressed as "display pixels PE" for the convenience in some cases in order to clearly distinguish them from the dummy pixels PD in the peripheral region 18 in expression. The display pixels PE are elements as minimum units of light emission.

Figure 2:
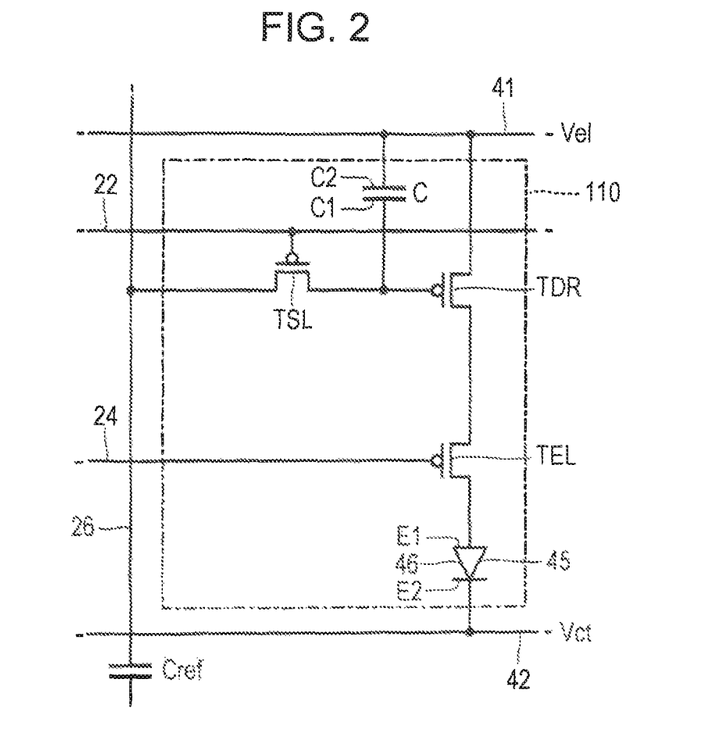
FIG. 2 is a circuit diagram of each display pixel located in a display region.

FIG. 2 is a circuit diagram of each display pixel PE located in the display region 16. As illustrated in FIG. 2, the display pixel PE is configured by including a light emitting element 45, a driving transistor TDR, a light emission control transistor TEL, a selecting transistor TSL, and a capacitive element C. Although P-channel transistors are employed for the respective transistors T (TDR, TEL, and TSL) of the display pixels PE in the embodiment, N-channel transistors can also be used.

The light emitting element 45 is an electro-optical element in which a light-emitting functional layer 46 including a light emitting layer formed with an organic EL material is interposed between a first electrode (anode) E1 and a second electrode (cathode) E2. The first electrode E1 is individually formed for each display pixel PE and the second electrode E2 is continuous over a plurality of pixels P. As is understood from FIG. 2, the light emitting element 45 is arranged on a path connecting a first power supply conductor 41 and a second power supply conductor 42 as a fourth conductive layer. The first power supply conductor 41 is a power supply wiring to which a higher power supply potential VEL is supplied and the second power supply conductor 42 is a power supply wiring to which a lower power supply potential (for example, ground potential) VCT is supplied.

The driving transistor TDR and the light emission control transistor TEL are arranged in series to the light emitting element 45 on the path connecting the first power supply conductor 41 and the second power supply conductor 42. To be specific, one (source) of a pair of current terminals of the driving transistor TDR is connected to the first power supply conductor 41. The light emission control transistor TEL functions as a switch controlling a conduction state (conduction/non-conduction) between the other (drain) of the pair of current terminals of the driving transistor TDR and the first electrode E1 of the light emitting element 45. The driving transistor TDR generates a driving current having a current amount in accordance with a gate-source voltage of itself. In a state in which the light emission control transistor TEL is controlled to be in an ON state, when the driving current is supplied to the light emitting element 45 from the driving transistor TDR after passed through the light emission control transistor TEL, the light emitting element 45 emits light with luminance in accordance with the current amount of the driving current. In a state in which the light emission control transistor TEL is controlled to be in an OFF state, supply of the driving current to the light emitting element 45 is blocked and the light emitting element 45 is turned OFF. A gate of the light emission control transistor TEL is connected to the control line 24.

The selecting transistor TSL in FIG. 2 functions as a switch controlling a conduction state (conduction/non-conduction) between the signal line 26 and a gate of the driving transistor TDR. A gate of the selecting transistor TSL is connected to the scan line 22. The capacitive element C is an electrostatic capacitance in which a dielectric is interposed between a first electrode C1 and a second electrode C2. The first electrode C1 is connected to the gate of the driving transistor TDR and the second electrode C2 is connected to the first power supply conductor 41 (source of the driving transistor TDR). Accordingly, the capacitive element C holds the gate-source voltage of the driving transistor TDR.

The signal line driving circuit 34 supplies gradation potentials (data signals) in accordance with gradations instructed for the respective display pixels PE by an image signal supplied from an external circuit to the plurality of signal lines 26 in parallel every writing period (horizontal scanning period). On the other hand, the scan line driving circuits 32 supply a scan signal to each scan line 22 to sequentially select each of the plurality of scan lines 22 every writing period. The selecting transistors TSL of the respective display pixels PE corresponding to the scan line 22 selected by the scan line driving circuits 32 shift to be in ON states. Accordingly, the gradation potentials are supplied to the gates of the driving transistors TDR of the respective display pixels PE after passed through the signal lines 26 and the selecting transistors TSL and the capacitive elements C hold voltages in accordance with the gradation potentials. On the other hand, when selection of the scan line 22 in the writing period is finished, the scan line driving circuits 32 supply a control signal to each control line 24 to control the light emission control transistors TEL of the respective display pixels PE corresponding to the control line 24 to be in the ON states. Accordingly, driving currents in accordance with the voltages held in the capacitive elements C in the last writing period are supplied to the light emitting elements 45 from the driving transistors TDR after passed through the light emission control transistors TEL. When the respective light emitting elements 45 emit light with luminance in accordance with the gradation potentials as described above, any image instructed by the image signal is displayed on the display region 16.

The specific configuration of the electro-optical device 1 in the embodiment will be described in detail below. In the respective drawings to be referred in the following description, dimensions and scales of respective elements are made different from those of the actual electro-optical device 1 for the convenience of explanation.

Figure 3:
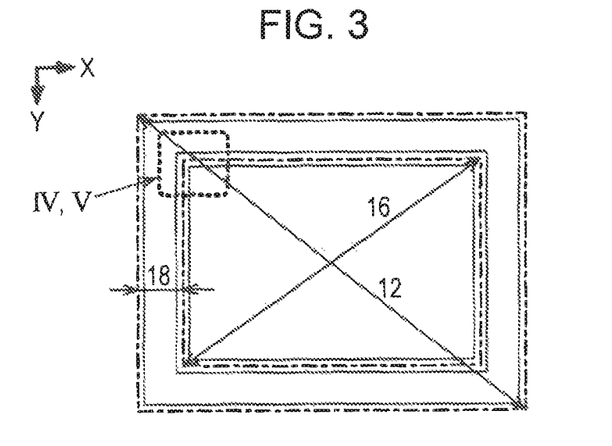
FIG. 3 is a plan view of a first region.
Figure 4:
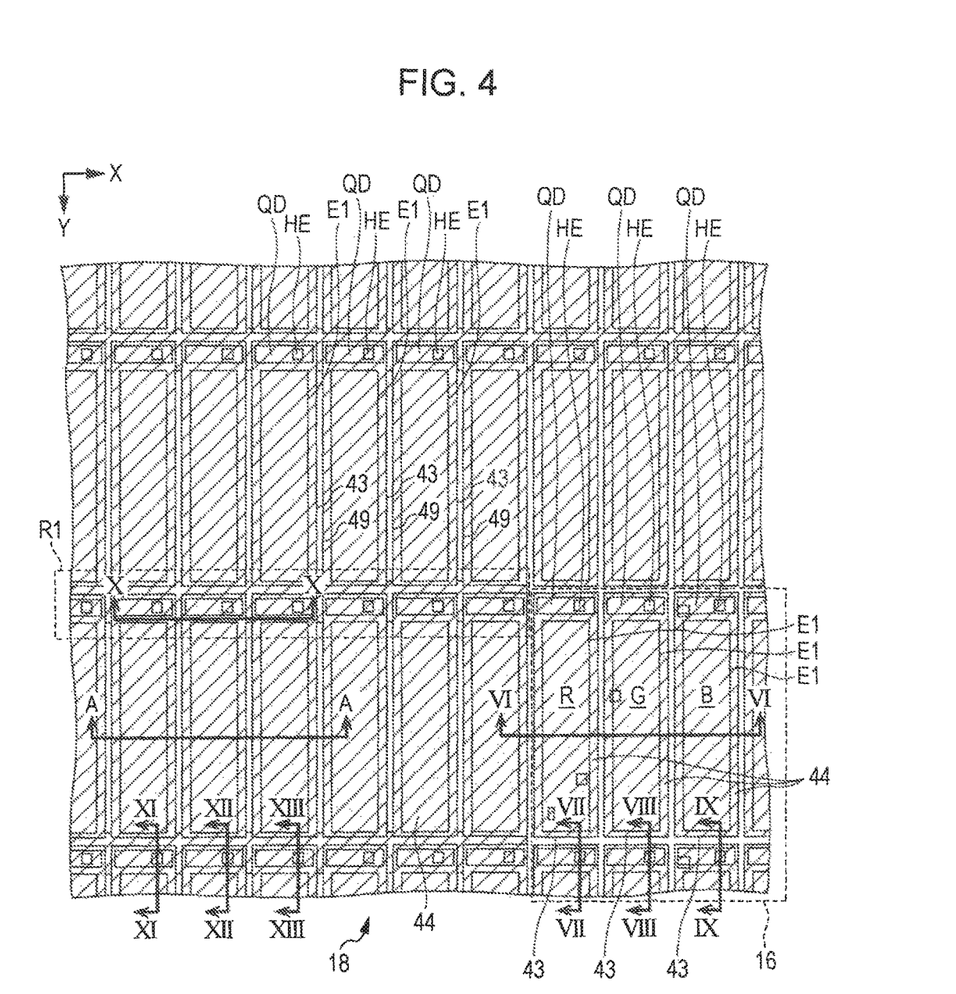
FIG. 4 is a partially broken plan view enlarging a region IV, V illustrated in FIG. 3.
Figure 5:
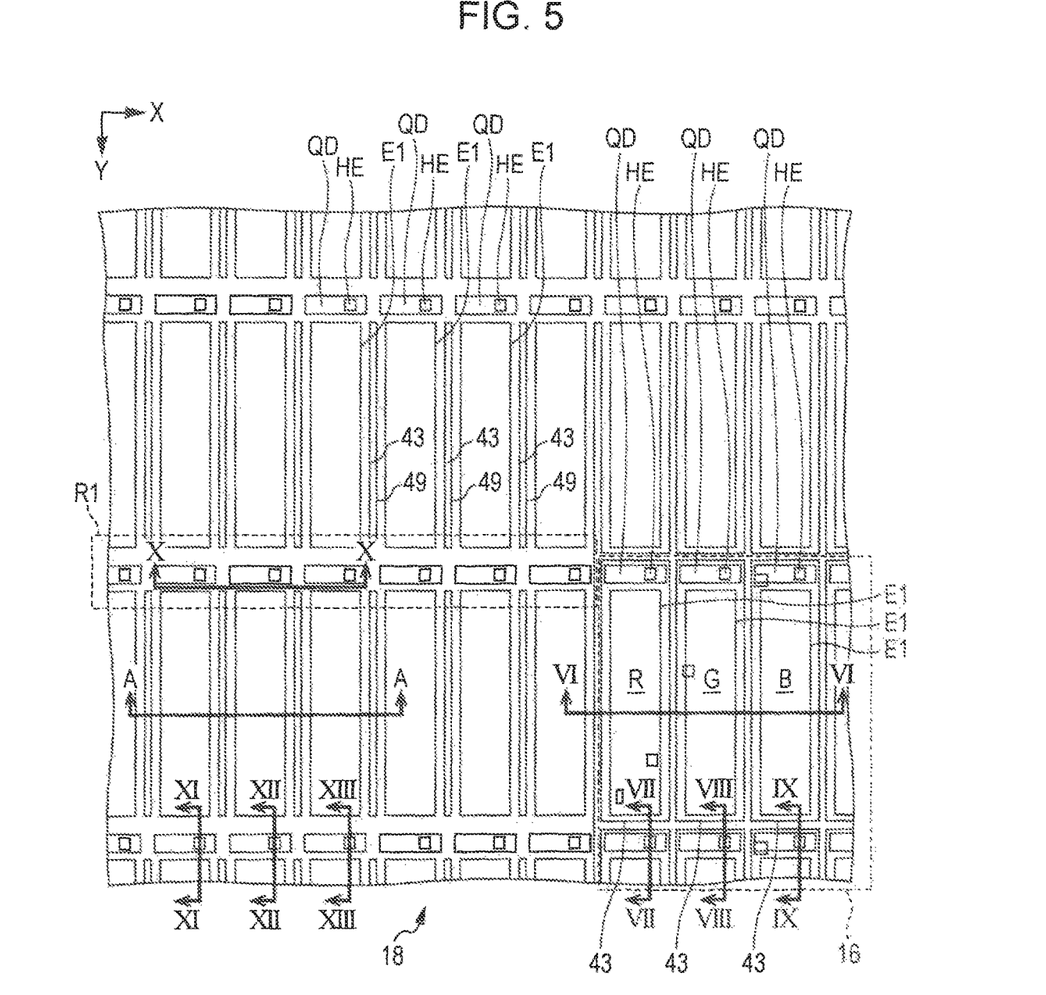
FIG. 5 is a partially broken plan view excluding an etching stop layer from FIG. 4.

FIG. 3 is a plan view of the first region 12. As is understood from FIG. 3, the first region 12 is divided into the display region 16 and the peripheral region 18. As described above, the display pixels PE are arranged in the matrix form in the display region 16. An image is actually displayed in the display region 16 by driving of the respective pixels PE. The dummy pixels PD that do not contribute to display of the image actually although having the similar structures to those of the respective pixels PE are arranged in the peripheral region 18. FIG. 4 and FIG. 5 are plan views enlarging a region IV, V illustrated in FIG. 3 and omit a part thereof using breaking lines. FIG. 5 is a view excluding an etching stop layer from FIG. 4 for easiness of understanding.

Figure 6:
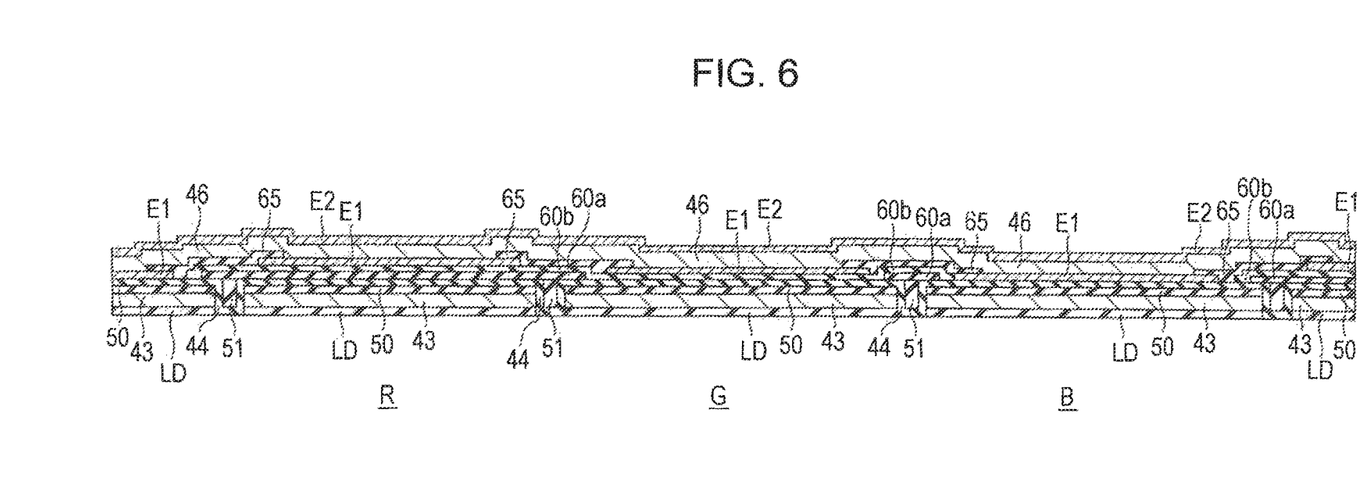
FIG. 6 is a cross-sectional view of pixels in the display region along a row direction.
Figure 7:
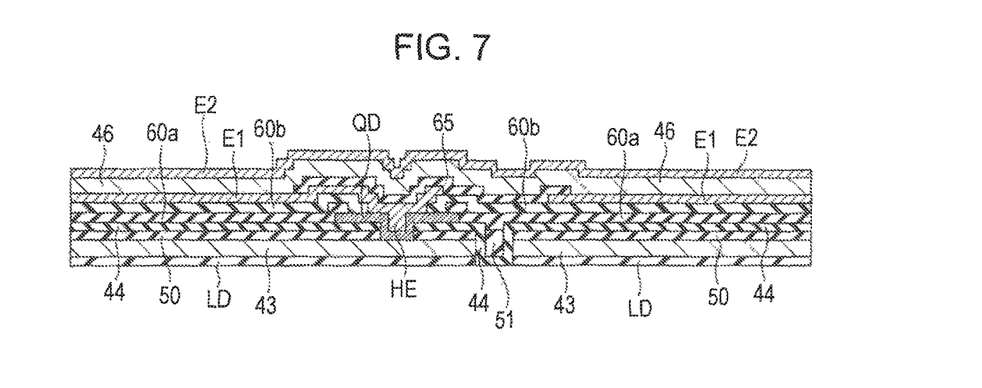
FIG. 7 is a cross-sectional view of the pixels in the display region along a column direction.
Figure 8:
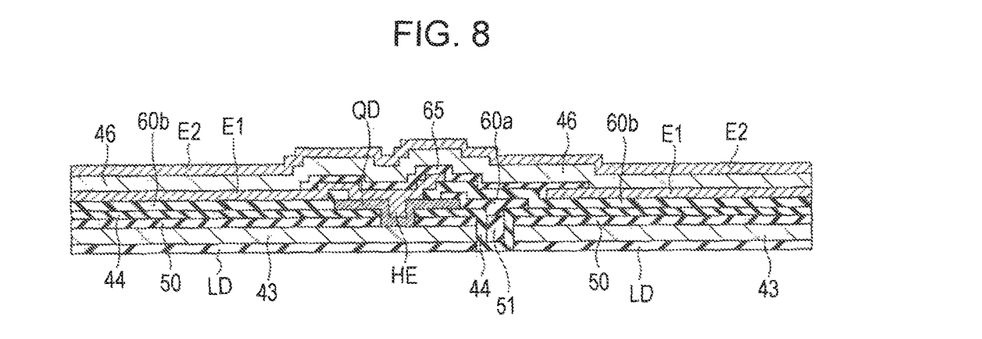
FIG. 8 is a cross-sectional view of the pixels in the display region along the column direction.
Figure 9:
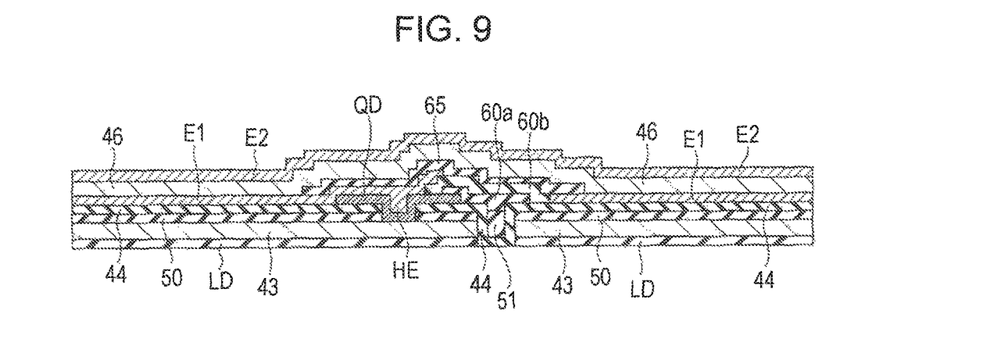
FIG. 9 is a cross-sectional view of the pixels in the display region along the column direction.

FIG. 6 is a cross-sectional view corresponding to a cross section including line VI-VI in FIG. 4. FIG. 7 is a cross-sectional view corresponding to a cross section including line VII-VII in FIG. 4. FIG. 8 is a cross-sectional view corresponding to a cross section including line VIII-VIII in FIG. 4. FIG. 9 is a cross-sectional view corresponding to a cross section including line IX-IX in FIG. 4.

Figure 10:
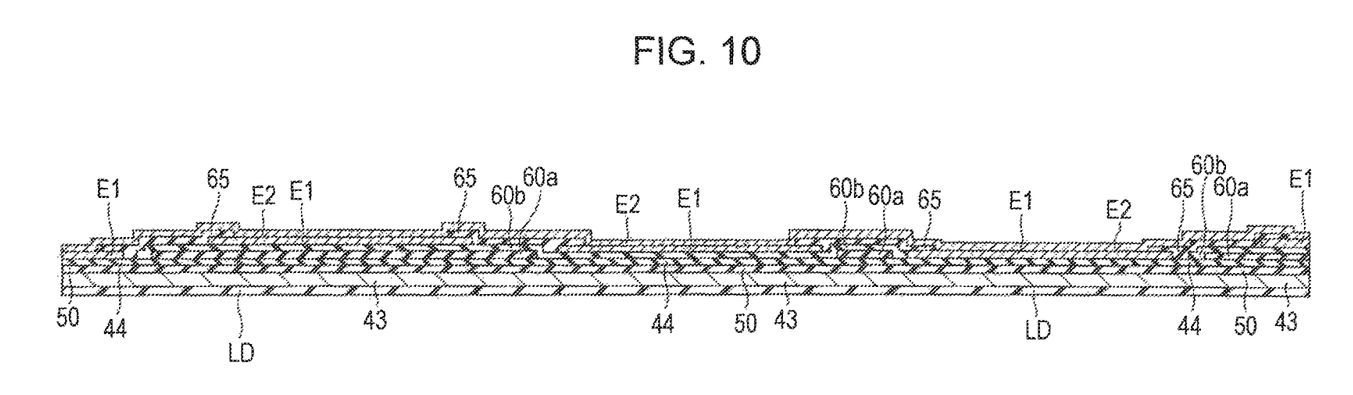
FIG. 10 is a cross-sectional view of pixels in a peripheral region along the row direction.
Figure 11:
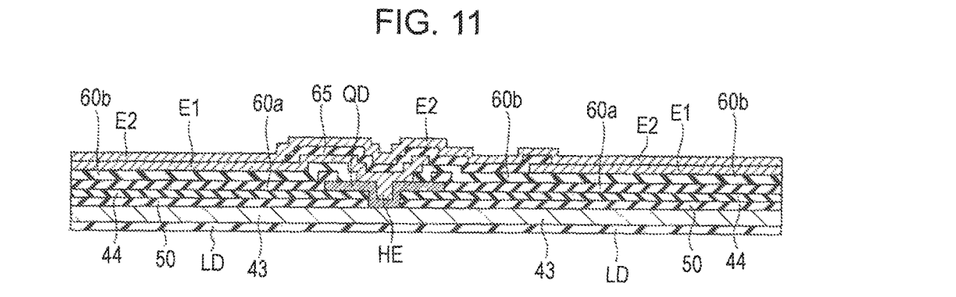
FIG. 11 is a cross-sectional view of the pixels in the peripheral region along the column direction.
Figure 12:
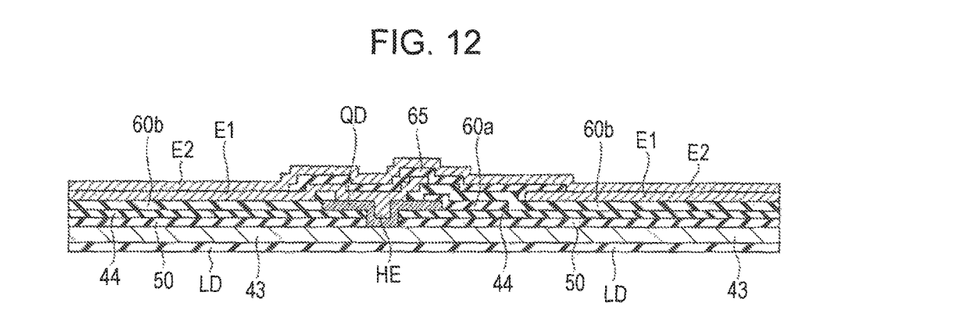
FIG. 12 is a cross-sectional view of the pixels in the peripheral region along the column direction.
Figure 13:
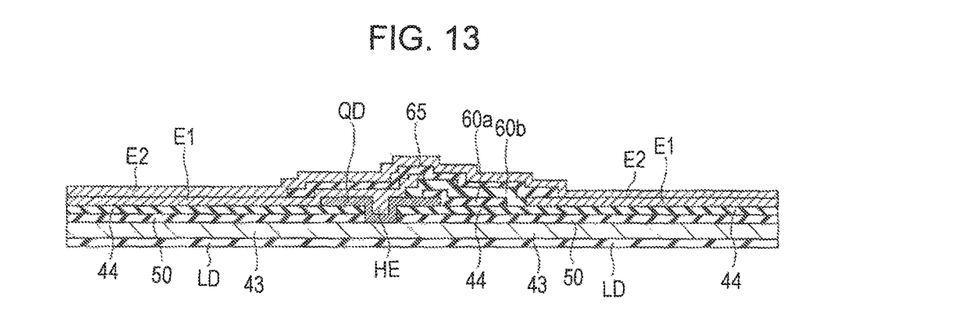
FIG. 13 is a cross-sectional view of the pixels in the peripheral region along the column direction.

FIG. 10 is a cross-sectional view corresponding to a cross section including line X-X in FIG. 4. FIG. 11 is a cross-sectional view corresponding to a cross section including line XI-XI in FIG. 4. FIG. 12 is a cross-sectional view corresponding to a cross section including line XII-XII in FIG. 4. FIG. 13 is a cross-sectional view corresponding to a cross section including line XIII-XIII in FIG. 4.

The display pixels PE are composed of sub pixels of red (R), sub pixels of green (G), and sub pixels of blue (B). As is understood from FIG. 4, in the display region 16, the sub pixels of red (R), the sub pixels of green (G), and the sub pixels of blue (B) are repeatedly arranged in this order with predetermined intervals along the row direction (X direction). The sub pixels of the same colors are arranged with predetermined intervals along the column direction (Y direction). As is understood from FIG. 4, also in the peripheral region 18, the dummy pixels PD corresponding to the above-described sub pixels are arranged with predetermined intervals along the row direction (X direction) and the column direction (Y direction).

In FIG. 6 to FIG. 9 illustrating the configuration of the electro-optical device 1 in the display region 16 and FIG. 10 to FIG. 13 illustrating the configuration of the electro-optical device 1 in the peripheral region 18, lowermost layers are illustrated as insulating layers LD for the convenience. Although not illustrated in the drawings, the respective transistors T (TDR, TEL, and TSL) of the display pixels PE are formed in layers under the insulating layers LD in the display region 16. To be specific, active regions (source/drain regions) of the respective transistors T (TDR, TEL, and TSL) of the display pixels PE are formed on the surface of the substrate 10 formed with the semiconductor material such as silicon. Furthermore, transistors of the dummy pixels PD, which correspond to the respective transistors T (TDR, TEL, and TSL) of the display pixels PE, are formed in the peripheral region 18.

Ions are injected into the active regions. Active layers of the respective transistors T (TDR, TEL, and TSL) of the display pixels PE and the dummy pixels PD are present between source regions and drain regions and ions of a type which is different from a type of the ions of the active regions are injected into the active layers.

The surface of the substrate 10 on which the active regions are formed are covered by gate insulating films and gates G (GDR, GEL, and GSL) of the respective transistors T are formed on the surfaces of the insulating films. The gates G of the respective transistors T oppose the active layers with the insulating films interposed therebetween.

On the surfaces of the insulating films on which the gates G of the respective transistors T are formed, a multilayered wiring layer formed by alternately laminating a plurality of insulating layers L (LA to LD) and a plurality of conductive layers (wiring layers) is formed. The respective insulating layers L are formed with an insulating inorganic material such as silicon compound (typically, silicon nitride or silicon oxide), for example. In the following description, a relation that a plurality of elements are collectively formed with the same process by selective removal of the conductive layer (single layer or a plurality of layers) is expressed as "formed from the same layer".

The first power supply conductor 41 and the second power supply conductor 42 are formed in a layer above the layer in which the gates G of the respective transistors T are formed. The first power supply conductor 41 is formed in the display region 16 of the first region 12 and the second power supply conductor 42 is formed in the peripheral region 18 of the first region 12. The first power supply conductor 41 and the second power supply conductor 42 are formed to be separated from each other and are electrically insulated from each other. The first power supply conductor 41 is conducted to the mounting terminal 36 to which the higher power supply potential VEL is supplied through the wirings (not illustrated) in the multilayered wiring layer. In the same manner, the second power supply conductor 42 is conducted to the mounting terminal 36 to which the lower power supply potential VCT is supplied through the wirings (not illustrated) in the multilayered wiring layer. The first power supply conductor 41 and the second power supply conductor 42 in the embodiment are formed with a light-reflective conductive material containing silver and aluminum, for example, so as to have film thicknesses of approximately 100 nm.

The insulating layers LD as illustrated in FIG. 6 to FIG. 9 and FIG. 10 to FIG. 13 are formed on the layers in which the first power supply conductor 41 and the second power supply conductor 42 are formed. As illustrated in FIG. 6 to FIG. 9, reflection layers 43 as first conductive layers are formed on the surfaces of the insulating layers LD in the display region 16. The reflection layers 43 are formed with a light-reflective conductive material containing silver and aluminum, for example. The reflection layers 43 are provided so as to extend in the column direction (Y direction) for the respective sub pixels of blue (B), green (G), and red (R) and form rectangular regions when seen from the above, as illustrated in FIG. 4 and FIG. 5. The reflection layers 43 are arranged with predetermined intervals in the row direction (X direction) and the column direction (Y direction).

As illustrated in FIG. 10 to FIG. 13, the reflection layers 43 as the first conductive layer are formed on the surfaces of the insulating layers LD also in the peripheral region 18 with the same process as that in the display region 16. Accordingly, the reflection layers 43 in the peripheral region 18 are also formed with the light-reflective conductive material containing silver and aluminum, for example. Also in the peripheral region 18, the reflection layers 43 are arranged with predetermined intervals in the row direction (X direction) and the column direction (Y direction) so as to correspond to the individual dummy pixels PE. Accordingly, as illustrated in FIG. 4 and FIG. 5, spaces 49 are formed between the adjacent reflection layers 43 in the row direction (X direction) as in the display region 16. Therefore, although not illustrated in the drawings, a cross-sectional view corresponding to a cross section including line A-A illustrated in FIG. 4 and FIG. 5 is similar to that in FIG. 6 in the display region 16.

It should be noted that the reflection layers 43 are connected to each other with no space therebetween in the column direction (Y direction) as indicated in a region R1 in FIG. 4. The state in which the reflection layers 43 are connected in the peripheral region 18 can be understood from FIG. 10 to FIG. 13.

In the embodiment, the reflection layers 43 in the peripheral region 18 are electrically connected to the second electrode E2 as a third conductive layer. That is to say, the reflection layers 43 in the peripheral region 18 are set to have the same potential as the cathode potential.

As is understood from FIG. 6 and FIG. 10, reflection enhancing layers 50 are formed on the reflection layers 43. The reflection enhancing layers 50 are formed with silicon dioxide or the like, for example. The reflection enhancing layers 50 have a higher refractive index than the reflection layers 43 formed with metal, thereby improving reflection characteristics of the reflection layers 43.

As is understood from FIG. 6 to FIG. 9 and FIG. 10 to FIG. 13, a stopper layer 44 as an etching stop layer is formed on the reflection enhancing layers 50. The stopper layer 44 is formed with silicon nitride or the like, for example. The stopper layer 44 is a layer that is formed for preventing the layers in which the above-described transistors T are formed from being damaged at the time of etching when optical adjustment layers are formed. In FIG. 4, hatching which is the same as that for the stopper layer 44 illustrated in FIG. 6 to FIG. 9 and FIG. 10 to FIG. 13 is added for the convenience.

The stopper layer 44 is formed so as to cover the reflection layers 43. Therefore, in the display region 16, as illustrated in FIG. 6 to FIG. 9, recesses are formed so as to correspond to the spaces between the reflection layers 43 adjacent in the row direction (X direction) and the column direction (Y direction). The recesses are embedded with embedding oxide layers 51, as illustrated in FIG. 6 to FIG. 9. The embedding oxide layers 51 are formed with silicon dioxide or the like, for example.

The recesses as formed in the display region 16 are not formed on the stopper layers 44 at positions corresponding to the portions in which the reflection layers 43 are connected in the peripheral region 18, as illustrated in FIG. 10 to FIG. 13. However, recesses are formed in the portions including line A-A illustrated in FIG. 4 as in the display region 16 and are embedded with the embedding oxide layers 51.

As illustrated in FIG. 4 to FIG. 9, relay electrodes QD are formed on the surfaces of the stopper layer 44 and the embedding oxide layers 51. The relay electrodes QD are wirings that are connected to the light emission control transistors TEL. The relay electrodes QD are formed in the display region 16 and the peripheral region 18. The relay electrodes QD are formed with a light-shielding conductive material (for example, titanium nitride), for example.

As illustrated in FIG. 6 to FIG. 9 and FIG. 10 to FIG. 13, first light path adjusting layers 60a as island-like insulating layers are formed on the surfaces of the stopper layer 44, the embedding oxide layers 51, and the relay electrodes QD. Second light path adjusting layers 60b as island-like insulating layers are formed on the surfaces of the first light path adjusting layers 60a in the sub pixels of red (R). The first light path adjusting layers 60a and the second light path adjusting layers 60b are light-transmitting film members defining resonance wavelengths (that is, display colors) of resonance structures of the respective display pixels PE. The first light path adjusting layers 60a and the second light path adjusting layers 60b are formed with silicon dioxide or the like, for example. Details of the resonance structures of the respective display pixels PE, the first light path adjusting layers 60a, and the second light path adjusting layers 60b will be described later.

As illustrated in FIG. 6 to FIG. 9 and FIG. 10 to FIG. 13, the first electrodes E1 as second conductive layers are formed on the surfaces of the first light path adjusting layers 60a or the second light path adjusting layers 60b for the respective display pixels PE in the display region 16. Furthermore, the first electrodes E1 are formed for the respective dummy pixels PD in the peripheral region 18. The first electrodes E1 are formed with a light-transmitting conductive material such as indium tin oxide (ITO), for example. The first electrodes E1 are substantially rectangular electrodes (pixel electrodes) functioning as the anodes of the light emitting elements 45, as described above with reference to FIG. 2. The first electrodes E1 make contact with the relay electrodes QD via through-holes HE, as illustrated in FIG. 4 to FIG. 9 and FIG. 10 to FIG. 13. That is to say, the first electrodes E1 are conducted to the active regions (drains) of the light emission control transistors TEL via a plurality of relay electrodes (not illustrated) in addition to the relay electrodes QD.

As illustrated in FIG. 6 to FIG. 9 and FIG. 10 to FIG. 13, a pixel defining layer 65 is formed on the surfaces of the first light path adjusting layers 60a or the second light path adjusting layers 60b on which the first electrodes E1 are formed over the entire area of the substrate 10. The pixel defining layer 65 is formed with an insulating inorganic material such as silicon compound (typically, silicon nitride or silicon oxide), for example. Although not illustrated in the drawings, openings corresponding to the respective first electrodes E1 in the display region 16 and the peripheral region 18 are formed in the pixel defining layer 65. Regions of the pixel defining layer 65 in the vicinity of inner peripheral edges of the openings overlap with peripheral edges of the first electrodes E1. That is to say, the inner peripheral edges of the openings are located at the inner side of the peripheral edges of the first electrodes E1 when seen from the above. As is understood from the above description, the pixel defining layer 65 is formed in a grid form when seen from the above.

The light-emitting functional layer 46 is formed on the surfaces of the first light path adjusting layers 60a or the second light path adjusting layers 60b on which the first electrodes E1 and the pixel defining layer 65 are formed. The light-emitting functional layer is formed in the display region 16 of the first region 12 and is continuous over the plurality of display pixels PE. On the other hand, the light-emitting functional layer is not formed in the peripheral region 18 and the second region 14. The light-emitting functional layer includes the light emitting layer formed with the organic EL material and emits white light upon supply of electric current. It should be noted that the light-emitting functional layer 46 can also include a transport layer or an injection layer of electrons and holes which are supplied to the light emitting layer.

The second electrode E2 as the third conductive layer is formed on the surfaces of the first light path adjusting layers 60a or the second light path adjusting layers 60b on which the light-emitting functional layer is formed over the entire area of the first region 12 (the display region 16 and the peripheral region 18). The second electrode E2 functions as the cathodes of the light emitting elements 45 as described above with reference to FIG. 2. Regions (light emitting regions) of the light-emitting functional layer, which are interposed between the first electrodes E1 and the second electrode E2, at the inner side of the respective openings in the pixel defining layer 65 emit light. That is to say, portions in which the first electrodes E1, the light-emitting functional layer, and the second electrode E2 are laminated at the inner side of the openings function as the light emitting elements 45. As is understood from the above description, the pixel defining layer 65 defines planar shapes and the sizes (regions emitting light actually) of the light emitting elements 45 for the respective display pixels PE. The electro-optical device 1 in the embodiment is a micro display in which the light emitting elements 45 are arranged with extremely high definition. For example, an area (area of one opening) of one light emitting element 45 is set to be equal to or smaller than 40 μm$^2$ and an interval between the light emitting elements 45 that are adjacent to each other in the X direction is set to be equal to or larger than 0.5 µm and equal to or smaller than 2.0 µm.

Portions of the second electrode E2 over the entire area of the first region 12, which are located in the peripheral region 18, are electrically connected to the above-described reflection layers 43 in the peripheral region 18 because the light-emitting functional layer is not formed in the peripheral region 18 as described above. As is understood from the above description, the second electrode E2 formed over both of the display region 16 and the peripheral region 18 is conducted to the second power supply conductor 42 as the fourth conductive layer through the reflection layers 43 in the peripheral region 18. That is to say, the lower power supply potential VCT is supplied to the second electrode E2 through the reflection layers 43 from the second power supply conductor 42. Although the light-emitting functional layer is formed in a part of the peripheral region 18 in some cases depending on conditions at the time of formation of the light-emitting functional layer, the second electrode E2 is electrically connected to the reflection layers 43 as long as the first electrodes E1 are exposed in another part of the peripheral region 18.

The second electrode E2 functions as a semi-transmitting reflection layer having property (semi-transmitting reflectivity) of transmitting a part of light which has reached the surface thereof and reflecting remaining part of the light. For example, the semi-transmitting reflective second electrode E2 is formed by forming a light-reflective conductive material such as alloy containing silver and magnesium into a sufficiently thin film thickness. Emitted light from the light-emitting functional layer reciprocates between the reflection layers 43 and the second electrode E2, a component thereof having a specific resonance wavelength is selectively amplified, and then, the light passes through the second electrode E2 and is output to the observation side (opposite side to the substrate 10). That is to say, the resonance structures resonating the output light from the light-emitting functional layer are formed between the reflection layers 43 and the second electrode E2 functioning as the semi-transmitting reflection layer. The first light path adjusting layers 60a and the second light path adjusting layers 60b are elements for individually setting the resonance wavelengths (display colors) of the resonance structures for the respective display colors of the display pixels PE. To be specific, the resonance wavelengths of the output light on the respective display pixels PE are set for the respective display colors by appropriately adjusting light path lengths (optical distances) between the first power supply conductor 41 and the second electrode E2 configuring the resonance structures in accordance with the film thicknesses of the first light path adjusting layers 60a and the second light path adjusting layers 60b.

The first light path adjusting layers 60a and the second light path adjusting layers 60b are formed with a light-transmitting insulating material such as silicon compound (typically, silicon nitride or silicon oxide). The first light path adjusting layers 60a are formed with silicon nitride, for example, so as to have the film thickness of equal to or larger than 40 nm and equal to or smaller than 100 nm and the second light path adjusting layers 60b are formed with silicon oxide, for example, so as to have the film thickness of equal to or larger than 40 nm and equal to or smaller than 100 nm.

The first light path adjusting layers 60a and the second light path adjusting layers 60b are selectively removed by etching in accordance with the display colors of the respective display pixels PE. To be specific, in the display pixels PE of blue, the first light path adjusting layers 60a and the second light path adjusting layers 60b are removed. In the display pixels PE of green, the second light path adjusting layers 60b are removed and the light paths are adjusted by the first light path adjusting layers 60a. In the display pixels PE of red, the light paths are adjusted by lamination of the first light path adjusting layers 60a and the second light path adjusting layers 60b.

Although the display region 16 has been focused in the above description, the first light path adjusting layers 60a and the second light path adjusting layers 60b having the same configurations as those in the display region 16 are formed also in the dummy pixels PD in the peripheral region 18.

Although not illustrated in the drawings, a sealing member is formed on the surface of the second electrode E2 over the entire area of the substrate 10. The sealing member is a light-transmitting film member preventing entrance of the outside air and water by sealing the respective elements formed on the substrate 10. The respective mounting terminals 36 in FIG. 1 are exposed to the outside through openings formed in regions of the sealing member, which are connected to the flexible wiring substrate.

The sealing member is formed on the surface of the second electrode E2 and makes direct contact with the surface of the second electrode E2. The sealing member is formed with an insulating inorganic material such as silicon compound (typically, silicon nitride or silicon oxide), for example, so as to have a film thickness of approximately 200 nm to 400 nm, for example. A high-density plasma film formation technique such as a plasma chemical vapor deposition (CVD) method, an electron cyclotron resonance (ECR) plasma sputtering method, and an ion plating method is preferably used for formation of the sealing member. A sealing member formed with silicon oxynitride can also be formed by depositing silicon oxide in a nitrogen atmosphere. Furthermore, inorganic oxides represented by metal oxides such as titanium oxide can also be used as a material of the sealing member.

As described above, in the embodiment, not only the display pixels PE are arranged in the display region 16 but also the dummy pixels PD having the same structures as those of the display pixels PE are arranged in the peripheral region 18. Furthermore, the display pixels PE and the dummy pixels PD are arranged with the predetermined intervals in the row direction (X direction) and the column direction (Y direction). In particular, the reflection layers 43 are arranged for the respective display pixels PE in the display region 16 with the predetermined intervals in the row direction (X direction) and the column direction (Y direction). Furthermore, also in the peripheral region 18, the reflection layers 43 are arranged with the intervals that are the same as the predetermined intervals in the display region 16 in the row direction (X direction) and the column direction (Y direction), subsequently to the display region 16. The first electrodes E1, and the first light path adjusting layers 60a and the second light path adjusting layers 60b as the insulting layers are arranged for the respective display pixels PE in the display region 16. In addition, the first electrodes E1, and the first light path adjusting layers 60a and the second light path adjusting layers 60b are arranged also in the peripheral region 18 so as to correspond to the respective reflection layers 43. The electro-optical device 1 is configured as described above in the embodiment and the display region 16 and the peripheral region 18 therefore have the same pattern density. As a result, uniformity of etching is improved when the reflection enhancing layers 50 and the stopper layer 44 are formed on the reflection layers 43, and the first light path adjusting layers 60a and the second light path adjusting layers 60b are further formed thereon. Accordingly, defects on the first light path adjusting layers 60a and the second light path adjusting layers 60b are difficult to be generated in the vicinity of the boundary between the display region 16 and the peripheral region 18, thereby suppressing generation of failures such as short circuit between the first electrodes E1 and another conductive layer.

Furthermore, in the peripheral region 18, the respective reflectance layers 43 arranged for the respective dummy pixels PD are partially connected to each other as indicated in the region R1 in FIG. 4 and are electrically connected to the second electrode E2 having the cathode potential. That is to say, the potentials of the reflectance layers 43 in the peripheral region 18 are equal to the cathode potential. Therefore, even if the defects on the first light path adjusting layers 60a and the second light path adjusting layers 60b are generated and the first electrodes E1 in the display region 16 and the reflectance layers 43 in the peripheral region 18 are short-circuited, the first electrodes E1 have the cathode potential. This can prevent failures such as erroneous light emission of the pixels with the short-circuited first electrode E1.

Moreover, in the embodiment, the stopper layer 44 is arranged between the first light path adjusting layers 60a and the second light path adjusting layers 60b as the insulating layers and the reflection layers 43. The end portions of the first light path adjusting layers 60a and the second light path adjusting layers 60b in the respective display pixels PE are located on the stopper layer 44 when seen from the above as is understood from FIG. 6 to FIG. 9. Accordingly, etching of the first light path adjusting layers 60a and the second light path adjusting layers 60b is performed on the flattened surface of the stopper layer 44, thereby improving uniformity of the etching. As a result, generation of the defects on the first light path adjusting layers 60a and the second light path adjusting layers 60b can be suppressed.

Variations

The invention is not limited to the above-described embodiments and, for example, the following various variations can be made. Furthermore, it is needless to say that the embodiments and variations can be appropriately combined.

(1) In the above-described embodiment, the reflection layers 43 in the peripheral region 18 are electrically connected to the second electrode E2. The embodiment is however not limited to the configuration and the second electrode E2 in the peripheral region 18 may be electrically isolated from the display region 16 and the reflection layers 43 in the peripheral region 18 may be electrically connected to the second power supply conductor 42 as the power supply wiring having the ground potential.

(2) In the above-described embodiment, the reflection layers and the openings in the sub pixels of the display pixels PE and the dummy pixels PD are provided so as to extend in the column direction (Y direction) and the plurality of sub pixels are arranged with the common intervals in the column direction (Y direction). In addition, the reflection layers and the openings in the respective pixels are arranged with the common intervals also in the row direction (X direction). The embodiment is however not limited to the configuration and the reflection layers and the openings in the sub pixels of the display pixels PE and the dummy pixels PD may be provided so as to extend in the row direction (X direction) and the reflection layers and the openings may be arranged with common intervals in the column direction (Y direction). Furthermore, the reflection layers and the openings in the sub pixels of the respective colors are arrayed such that the widths thereof in the row direction (X direction) are equal to each other. The embodiment is however not limited to the configuration. For example, the following configuration may be employed. That is, the reflecting portions and the openings in the sub pixels of blue are made to extend in the column direction (Y direction) as illustrated in FIG. 4 such that the lengths thereof in the column direction (Y direction) are maximum. The lengths of the reflecting portions and the openings in the sub pixels of red and the reflecting portions and the openings in the sub pixels of green in the column direction (Y direction) are set to the half of the lengths of those in the sub pixels of blue. Under this conditions, the reflecting portions and the openings in the sub pixels of red and the reflecting portions and the openings in the sub pixels of green are arranged side by side in the column direction (Y direction). Alternatively, the following configuration may be employed. That is, the reflecting portions and the openings in the sub pixels of blue are made to extend in the row direction (X direction) such that the widths thereof in the row direction (X direction) are maximum. The widths of the reflecting portions and the openings in the sub pixels of red and the reflecting portions and the openings in the sub pixels of green in the row direction (X direction) are set to the half of the widths of those in the sub pixels of blue. Under this conditions, the reflecting portions and the openings in the sub pixels of red and the reflecting portions and the openings in the sub pixels of green are arranged side by side in the row direction (X direction).

(3) Although the OLED is employed as an example of the electro-optical material in the above-described embodiment, the embodiment is also applied to electro-optical devices using electro-optical materials other than the OLED. The electro-optical material is a material that is changed in the optical characteristics such as transmittance and luminance upon supply of an electric signal (current signal or voltage signal). For example, the embodiment can also be applied to a display panel using a light emitting element such as liquid crystal, inorganic EL, and light emitting polymer in the same manner as the above-described embodiment. Furthermore, the embodiment can also be applied to an electrophoretic display panel using microcapsules containing colored liquid and white particles dispersed in the liquid as the electro-optical material in the same manner as the above-described embodiment. Moreover, the embodiment can also be applied to a twist ball display panel using twist balls painted with different colors for regions having different polarities as the electro-optical material in the same manner as the above-described embodiment. The embodiment can also be applied to various electro-optical devices such as a toner display panel using black toner as the electro-optical material and a plasma display panel using high-pressure gas such as helium and neon as the electro-optical material in the same manner as the above-described embodiment.

Applications

Figure 14:
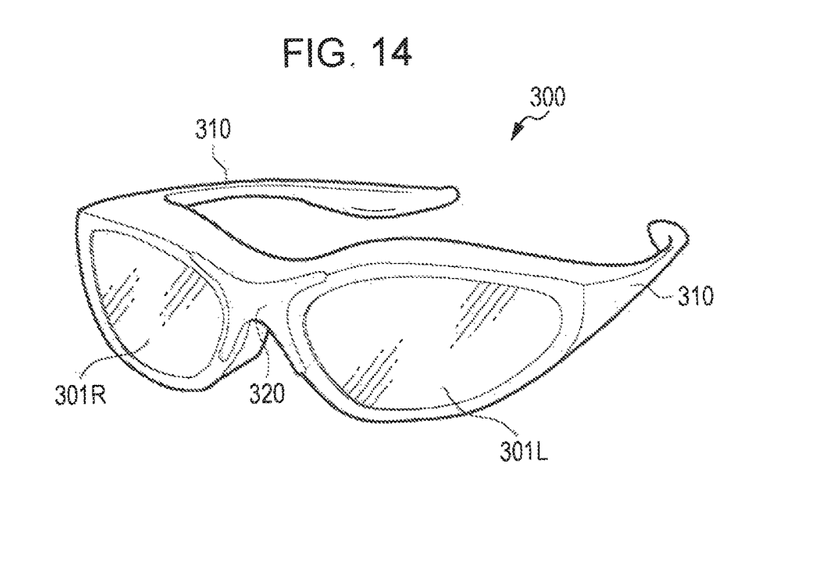
FIG. 14 is a descriptive view for explaining an example of an electronic apparatus.
Figure 15:
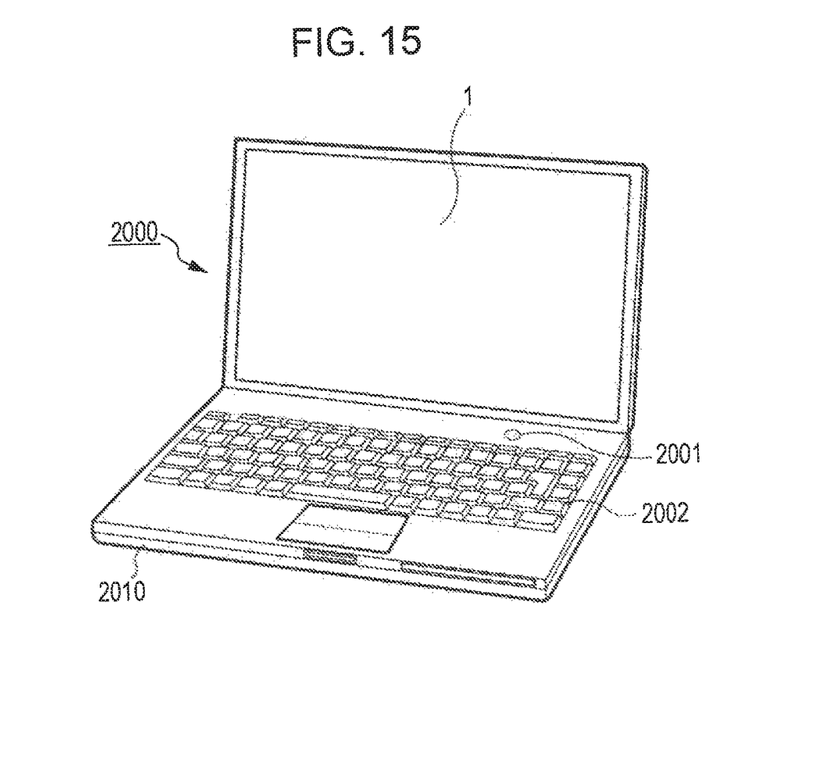
FIG. 15 is a descriptive view for explaining another example of the electronic apparatus.
Figure 16:
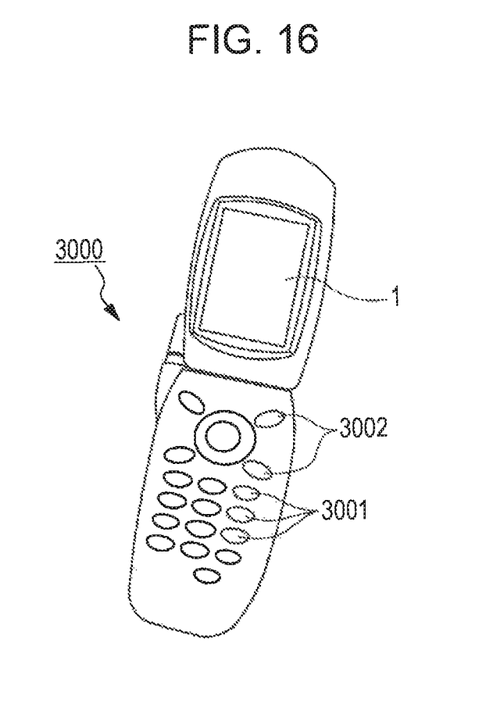
FIG. 16 is a descriptive view for explaining still another example of the electronic apparatus.

The embodiment can be utilized for various types of electronic apparatuses. FIG. 14 to FIG. 16 illustrate specific forms of the electronic apparatuses as application targets of the embodiment.

FIG. 14 is a perspective view illustrating outer appearance of a head mount display as the electronic apparatus employing the electro-optical device of the embodiment. As illustrated in FIG. 14, a head mount display 300 includes temples 310, a bridge 320, and projection optical systems 301L and 301R like common glasses when seen from the outside.

Although not illustrated in the drawing, the electro-optical device 1 for the left eye and the electro-optical device 1 for the right eye are provided in the vicinity of the bridge 320 at the back sides of the projection optical systems 301L and 301R.

FIG. 15 is a perspective view of a portable personal computer employing the electro-optical device. A personal computer 2000 includes the electro-optical device 1 displaying various types of images and a main body portion 2010 on which a power supply switch 2001 and a keyboard 2002 are installed.

FIG. 16 is a perspective view of a mobile phone. A mobile phone 3000 includes a plurality of operation buttons 3001 and scroll buttons 3002, and the electro-optical device 1 displaying various types of images. A screen displayed on the electro-optical device 1 is scrolled by operating the scroll buttons 3002. The embodiment can also be applied to the mobile phone like this.

Examples of the electronic apparatus to which the embodiment can be applied include, in addition to the apparatuses as illustrated in FIG. 14 to FIG. 16, personal digital assistants (PDA). Other examples thereof include digital still cameras, televisions, video cameras, car navigation systems, on-vehicle displays (instrument panels), electronic notebooks, electronic paper, calculators, word processors, workstations, video phones, and POS terminals. Furthermore, the embodiment can be applied to printers, scanners, copying machines, video players, and apparatuses including touch panels, and the like.

The entire disclosure of Japanese Patent Application No. 2016-026437, filed Feb. 15, 2016 is expressly incorporated by reference herein.

What is claimed is:

1. An electro-optical device comprising:
   light-reflective first conductive layers that are arrayed in both of a display region and a peripheral region as a region around the display region;
   second conductive layers in which electrodes are arrayed in both of the display region and the peripheral region so as to overlap with the first conductive layers;
   a third conductive layer that is arranged so as to overlap with the second conductive layers;
   insulating layers that are arranged between the first conductive layers and the second conductive layers; and
   a light-emitting functional layer that is arranged between the second conductive layers and the third conductive layer,
   wherein a portion of the first conductive layers arranged in the peripheral region are electrically connected to each other with respective connection portions arranged in the same layer as the first conductive layers, and a cathode potential or a ground potential is applied to the first conductive layers arranged in the peripheral region.

2. The electro-optical device according to claim 1,
   wherein a portion of the second conductive layers arranged in the peripheral region are electrically connected to the third conductive layer in at least a portion of the peripheral region in which the light-emitting functional layer is not formed, and
   the cathode potential is applied to a portion of the third conductive layer, which overlaps with the display region, and the third conductive layer is electrically connected to the portion of the first conductive layers arranged in the peripheral region.

3. The electro-optical device according to claim 1, further including a fourth conductive layer to which a ground potential is applied,
   wherein the fourth conductive layer is electrically connected to the portion of the first conductive layers arranged in the peripheral region.

4. The electro-optical device according to claim 1, including an etching stop layer between the insulating layers and the first conductive layers,
   wherein the etching stop layer overlaps with end portions of the insulating layers when seen from the above.

5. An electro-optical device manufacturing method comprising:
   arraying first conductive layers as light-reflective electrodes in both of a display region and a peripheral region as a region around the display region;
   forming insulating layers on the first conductive layers;
   arraying second conductive layers in both of the display region and the peripheral region so as to overlap with the first conductive layers;
   forming a light-emitting functional layer on the second conductive layers; and
   forming a third conductive layer so as to overlap with the second conductive layers;
   wherein a portion of the first conductive layers arranged in the peripheral region are electrically connected to each other with respective connection portions arranged in the same layer as the first conductive layers, and are electrically connected to a supply part of a cathode potential or a ground potential.

6. An electronic apparatus comprising the electro-optical device according to claim 1.

7. An electronic apparatus comprising the electro-optical device according to claim 2.

8. An electronic apparatus comprising the electro-optical device according to claim 3.

9. An electronic apparatus comprising the electro-optical device according to claim 4.

* * * * *